(12) United States Patent
Lostetter et al.

(10) Patent No.: US 8,410,600 B2
(45) Date of Patent: Apr. 2, 2013

(54) SEMICONDUCTOR DEVICE WITH PROTECTING FILM AND METHOD OF FABRICATING THE SEMICONDUCTOR DEVICE WITH PROTECTING FILM

(75) Inventors: Alexander B. Lostetter, Fayetteville, AR (US); Jared Hornberger, Springdale, AR (US); Takukazu Otsuka, Kyoto (JP)

(73) Assignees: Arkansas Power Electronics International, Inc., Fayetteville, AR (US); Rohm Co., Ltd. (JP)

(*) Notice: Subject to any disclaimer, the term of this patent is extended or adjusted under 35 U.S.C. 154(b) by 121 days.

(21) Appl. No.: 12/876,614

(22) Filed: Sep. 7, 2010

(65) Prior Publication Data

US 2011/0079792 A1 Apr. 7, 2011

Related U.S. Application Data

(60) Provisional application No. 61/247,990, filed on Oct. 2, 2009.

(51) Int. Cl.
*H01L 29/41* (2006.01)

(52) U.S. Cl. ......... 257/700; 257/E29.255; 257/E21.159; 438/586

(58) Field of Classification Search .................... 257/77, 257/692, 700, E29.255, E21.158, E21.159; 438/585, 586
See application file for complete search history.

(56) References Cited

U.S. PATENT DOCUMENTS

| | | | |
|---|---|---|---|
| 8,138,587 B2 * | 3/2012 | Otremba | ........................ 257/676 |
| 2005/0287721 A1 | 12/2005 | Yamamoto et al. | |
| 2006/0151871 A1 | 7/2006 | Mehrotra | |
| 2008/0221806 A1 | 9/2008 | Bryant et al. | |
| 2009/0072379 A1 * | 3/2009 | Ewe et al. | ..................... 257/700 |

FOREIGN PATENT DOCUMENTS

| | | |
|---|---|---|
| GB | 2443577 A | 5/2008 |
| JP | 4-503480 A | 6/1992 |
| WO | 90/09255 A1 | 8/1990 |
| WO | 2006/074165 A2 | 7/2006 |

OTHER PUBLICATIONS

International Search Report for PCT/US2010/050868, dated Nov. 29, 2010.
Written Opinion of the International Searching Authority for PCT/US2010/050868, mailed Nov. 29, 2010.
Warren C. Welch et al., "Transfer of Metal MEMS Packages Using a Wafer-Level Solder Transfer Technique", IEEE Transactions on Advanced Packaging, vol. 28, No. 4, Nov. 2005, pp. 643-649.
T. Stoltenhoff et al., "Microstructures and key properties of cold-sprayed and thermally sprayed copper coatings", Surface & Coatings Technology, 200(2006), pp. 4947-4960.

* cited by examiner

*Primary Examiner* — Wensing Kuo
(74) *Attorney, Agent, or Firm* — Cantor Colburn LLP

(57) ABSTRACT

Provided are a semiconductor device and a method of fabricating the semiconductor device, the semiconductor device including: a source trace, a drain trace, and a gate trace placed on a substrate; a transistor which is placed on the drain trace and includes a source pad and a gate pad; insulating films placed between the drain and source traces and between the drain and gate traces on the substrate so as to cover sidewall surfaces of the transistor; a source spray electrode which is placed on the insulating film between the source and drain traces and connects the source pad of the transistor and the source trace; and a gate spray electrode placed on the insulating film between the gate and drain traces and connects the gate pad of the transistor and the gate trace.

16 Claims, 14 Drawing Sheets

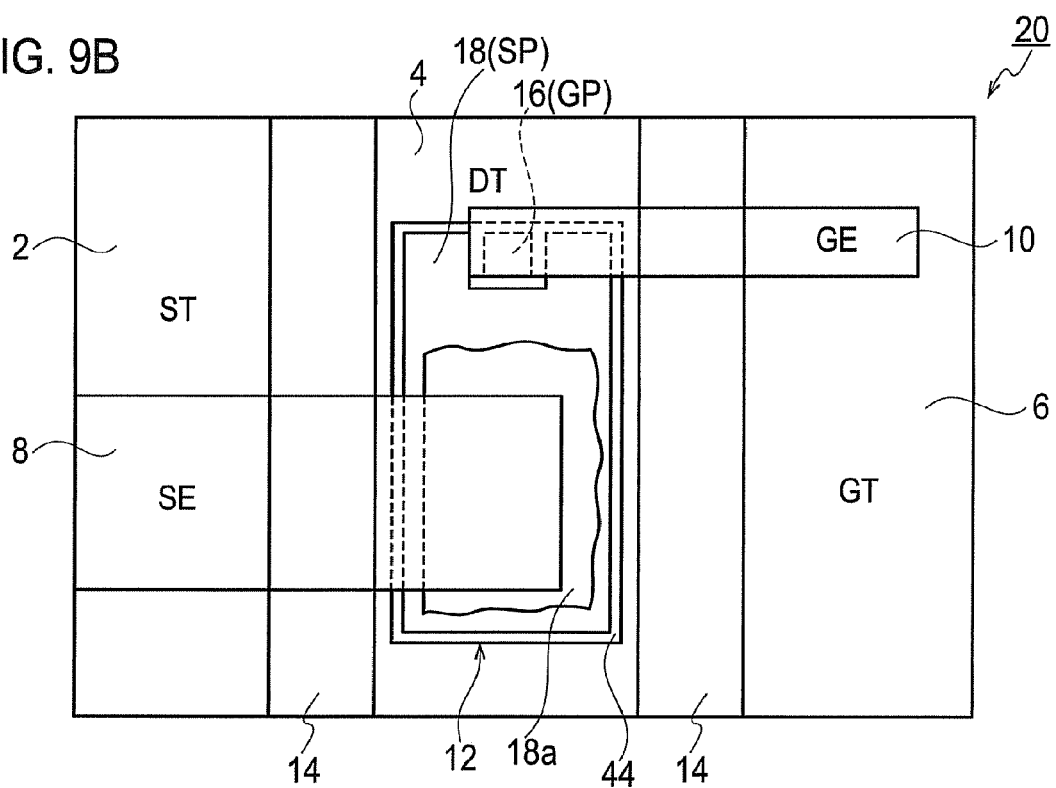

SEMICONDUCTOR DEVICE WITH PROTECTING FILM AND METHOD OF FABRICATING THE SEMICONDUCTOR DEVICE WITH PROTECTING FILM

CROSS REFERENCE TO RELATED APPLICATION

This application is based upon and claims the benefit of priority from U.S. provisional patent application Ser. No. 61/247,990 filed on Oct. 2, 2009, the entire contents of which are incorporated herein by reference.

TECHNICAL FIELD

The present invention relates to a semiconductor device and a method of fabricating the same and specifically relates to a semiconductor device including one or more power semiconductor devices and a substrate which are electrically connected and a method of fabricating the semiconductor device.

BACKGROUND ART

Many research institutions are currently studying and developing silicon carbide (SiC) devices. The SiC devices are characterized by low on-resistance, high-speed switching, high-temperature operation, and the like.

The methods of connecting the SiC devices and low thermal resistance packages for the SiC devices are already disclosed (see Patent Literatures 1 and 2, for example). Patent Literatures 1 and 2 disclose methods of fabricating a package accommodating an SiC device. The SiC device is connected to another component or a conductive surface using a TLP bonding technique.

Each TLP technique disclosed in Patent Literatures 1 and 2 is a technique to connect the SiC device by using mixed crystals of three or four types of conductive metals simultaneously formed to form a high-temperature melting point connection. Because of use of the TLP connection of three or four types of metallic materials, the constituent materials of the mixed crystals of conductive metals are complicated.

On the other hand, a composite solder article containing Sn and/or Pb and having a comparatively low melting point of not more than 430° C., for example, is already disclosed (see Patent Literature 3, for example). In Patent Literature 3, the composite solder article is characterized in that the difference in temperature between liquid and solid phases of the solder alloy is smaller than that of the basic solder material.

Moreover, metallic transfer MEMS packages using a wafer-level solder transfer technique are already disclosed (see Non-Patent Literature 1, for example). In Non-patent Literature 1, a device wafer and a package cap are bonded by the TLP technique using a relatively thin Ni—Sn layer.

Furthermore, a spray technique is known as a technique to form copper (Cu) coating having a larger area than that of bonding wire, (see Non-patent Literature 2, for example).

CITATION LIST

Patent Literature 1: International Publication WO2006/074165
Patent Literature 2: US Patent Laid-open Publication US2006/0151871
Patent Literature 3: Japanese Patent Unexamined Application Publication (Translation of PCT) No. 04-503480
Non Patent Literature 1: Warren C. Welch, III, Junseok Chae, and Khalil Najafi, "Transfer of Metal MEMS Packages Using a Wafer-Level Solder Transfer Technique", IEEE TRANSACTION ON ADVANCED PACKAGING, VOL. 28, NO. 4, NOVEMBER 2005, pp. 643-649
Non Patent Literature 2: T. Stoltenhoff, C. Botchers, F. Gartner, H. Kreye, "Microstructures and key properties of cold-sprayed and thermally sprayed copper coatings", Surface & Coatings Technology, 200(2006), pp. 4947-4960

SUMMARY OF THE INVENTION

Technical Problem

The conventional methods of electrically connecting power semiconductor devices and substrates or power semiconductor devices and packages include a wire bonding technique using aluminum or gold wire between a pad of the semiconductor device and the substrate or between the pad of the semiconductor device and a pad or trace of the package. However, this method has limitations on the power level and the performance of high frequency switching of high power/high frequency semiconductor devices. This is because the inherent electrical parasitic inductance of the bonding wire causes over-voltage and over-current, which can limit the frequency characteristics of power semiconductor devices.

If the bonding wire could be replaced with a power interconnection structure having a wider and more rectangular cross-sectional area than that of the bonding wire, the parasitic inductance and resistance would be considerably reduced. Furthermore, the switching performance of the power device can be improved.

An object of the present invention is to provide a semiconductor device with considerably reduced parasitic inductance and resistance and improved high-frequency switching performance and provide a method of fabricating the semiconductor device.

Solution to Problem

According to an aspect of the present invention to achieve the aforementioned object, a semiconductor device is provided, the semiconductor device including: a substrate; a source trace, a drain trace, and a gate trace placed on the substrate; a transistor which is placed on the drain trace and includes a source pad and a gate pad; insulating films placed between the drain and source traces and between the drain and gate traces on the substrate to cover sidewall surfaces of the transistor; a source spray electrode which is placed on the insulating film between the source and drain traces and connects the source pad of the transistor and the source trace; and a gate spray electrode which is placed on the insulating film between the gate and drain traces and connects the gate pad of the transistor and the gate trace.

According to another aspect of the present invention, a method of fabricating a semiconductor device is provided, the method includes: forming a substrate; forming a source trace, a drain trace, and a gate trace on the substrate; forming a transistor on the drain trace, the transistor including a source pad and a gate pad; forming insulating films between the source and drain traces and between the gate and drain traces on the substrate, the insulating films covering sidewall surfaces of the transistor; forming a source spray electrode on the insulating film between the source and drain traces, the source spray electrode connecting the source pad of the transistor and the source trace; forming a gate spray electrode on the insulating film between the gate and drain traces, the gate spray electrode connecting the gate pad of the transistor and the gate trace.

Advantageous Effects of Invention

According to the present invention, it is possible to provide a semiconductor device with considerably reduced parasitic inductance and resistance and improved high frequency switching performance and to provide a method of fabricating the semiconductor device.

BRIEF DESCRIPTION OF DRAWINGS

FIG. 9B is an explanatory view of FIG. 9A.

DESCRIPTION OF EMBODIMENTS

Next, embodiments of the present invention are described with reference to the drawings. In the following description of the drawings, same or similar portions are given same or similar referential numerals or symbols. The drawings are schematic, and the relations between thicknesses and planar dimensions, the proportion of thicknesses of layers, and the like are different from the actual ones. Specific thicknesses and dimensions should be determined referring to the following description. Moreover, it is obvious that some portions have dimensional relations and proportions different in each drawing.

Moreover, the embodiments below illustrate the devices and methods embodying the technical idea of the present invention, and the embodiments of the present invention do not specify the materials, shapes, structures, arrangements, and the like of constituent components to those in the following description. The embodiments of the present invention can be variously changed within the scope of the claims.

First Embodiment (Configuration of Semiconductor Device)

Figure 1:
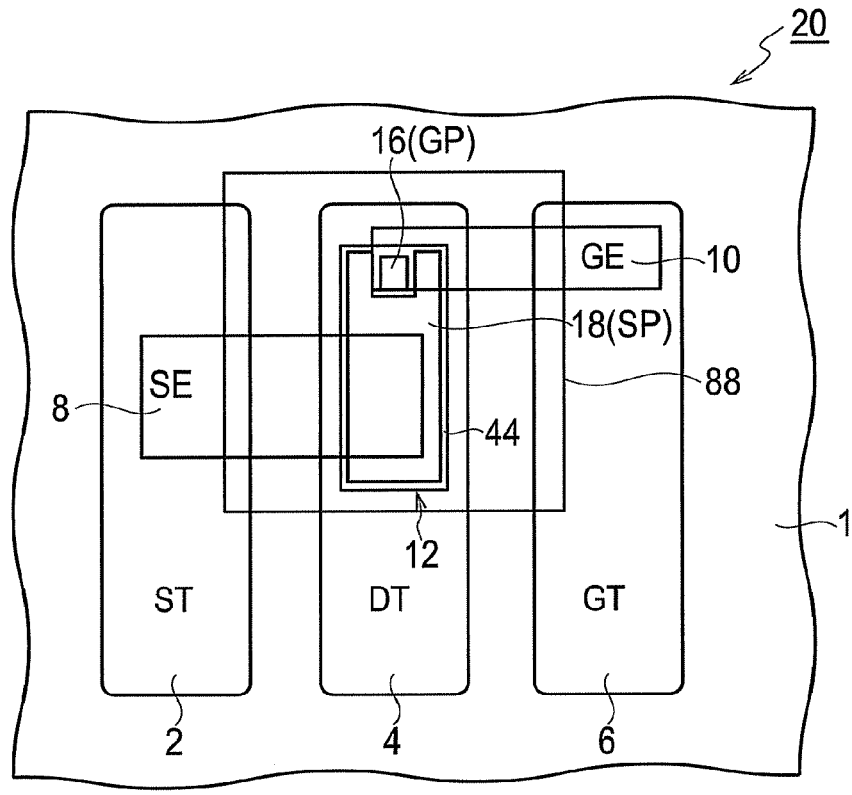
FIG. 1 is a schematic plane pattern configuration diagram of a semiconductor device according to a first embodiment of the present invention.

As shown in FIG. 1, a schematic plane pattern configuration of a semiconductor device according to a first embodiment of the present invention includes: a substrate 1; a source trace (ST) 2 placed on the substrate 1; a drain trace (DT) 4; a gate trace (GT) 6; a transistor 12 which is placed on the drain trace (DT) 4 and includes a source pad 18 and a gate pad 16; insulating films 14 placed between the source trace 2 and gate trace 6 and between the source trace 2 and drain trace 4 on the substrate 1 so as to cover sidewall surfaces of the transistor 12 (see FIG. 3); a source spray electrode (SE) 8 which is placed on the insulating film 14 provided between the source trace 2 and drain trace 4 and connects the source pad (SP) 18 of the transistor 12 and the source trace 2; and a gate spray electrode (GE) 10 which is placed on the insulating film 14 provided between the gate trace 6 and drain trace 4 (see FIG. 3) and connects the gate pad (GP) 16 of the transistor 12 and the gate trace 6.

Furthermore, as shown in FIG. 1, the schematic plane pattern configuration of the semiconductor device may include a seal layer 88 for encapsulation over the transistor 12.

The transistor 12 is provided with a guard ring 44 in the periphery of the chip for reducing the electrical field.

The substrate 1 is composed of an insulating substrate in order that the source trace (ST) 2, drain trace (DT) 4, and gate trace (GT) 6 are mounted thereon. The insulating substrate 1 can be made of aluminum nitride (AlN), alumina ($Al_2O_3$), silicon nitride (SiN), or the like, for example.

The source trace (ST) 2, drain trace (DT) 4, and gate trace (GT) 6 are made of aluminum or copper, for example, and may be plated with nickel (Ni) for preventing oxidation.

The insulating films 14 may be made of anyone of silicone resin, polymer resin, polyimide resin, and epoxy resin.

Figure 4:
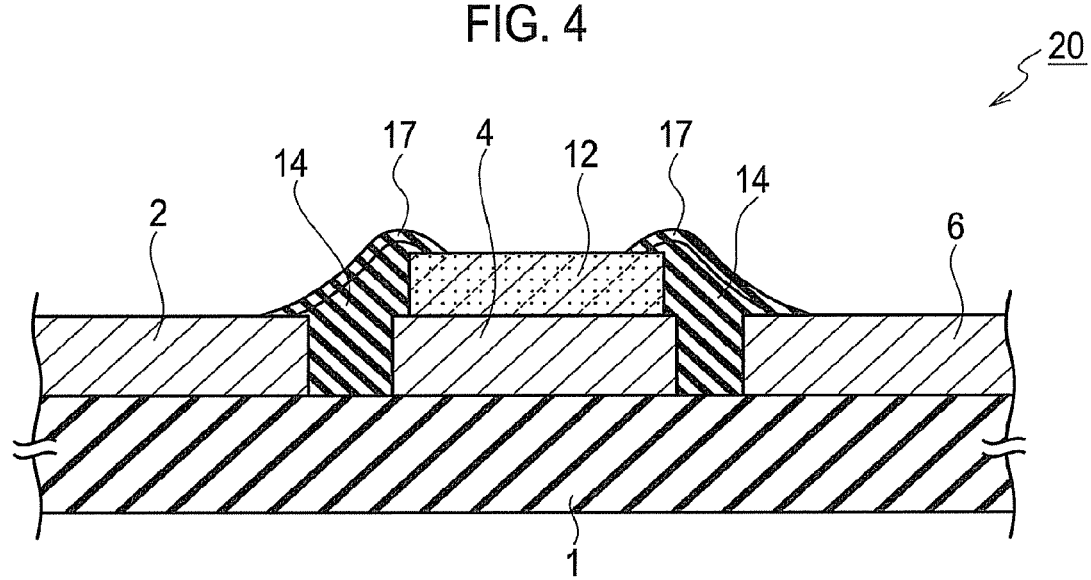
FIG. 4 is a schematic cross-sectional configuration diagram for explaining a step of the method of fabricating the semiconductor device according to the first embodiment of the present invention.

As shown in FIG. 4, protecting films 17 may be provided on the insulating films 14. The protecting films 17 may be made of any one of silicone resin, polymer resin, polyimide resin, and epoxy resin similarly to the insulating films 14.

Each of the source spray electrode (SE) 8 and gate spray electrode (GE) 10 may be made of any one of copper, silver, nickel, aluminum, platinum, palladium, nickel-chrome alloy, nickel-aluminum alloy, nickel-chrome-silicon alloy, nickel-silicon alloy, and copper-nickel alloy.

The transistor 12 can be an SiC MOSFET (metal oxide semiconductor field effect transistor), for example.

(Method of Fabricating Semiconductor Device)

As shown in FIG. 1, a method of fabricating the semiconductor device according to the first embodiment includes the steps of: forming the substrate 1; forming the source trace (ST) 2, drain trace (DT) 4, and gate trace (GT) 6 on the substrate 1; and forming the transistor 12, which includes the source pad (SP) 18 and gate pad (GP) 16, on the drain trace (DT) 4.

Figure 2:
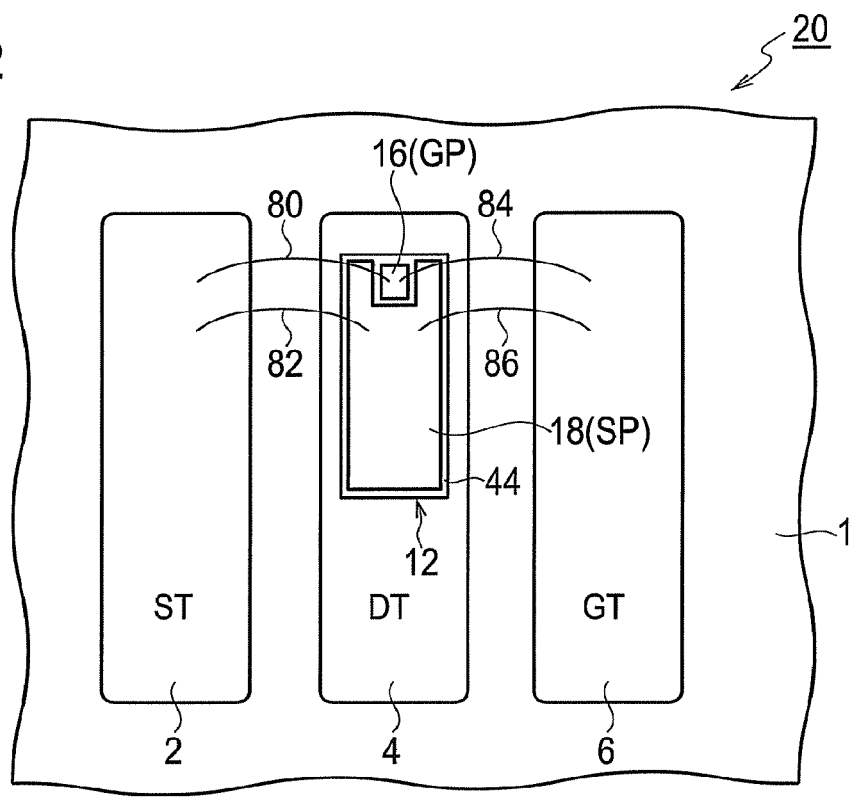
FIG. 2 is a schematic plane pattern diagram for explaining a step of a method of fabricating the semiconductor device according to the first embodiment of the present invention.

As shown in FIG. 2, the schematic plane pattern configuration for explaining a step of the method of fabricating the semiconductor device according to the first embodiment includes, after the step of forming the transistor 12 on the drain trace (DT) 4: a step of forming wire bonds 82, 80, 86, and 84 between the source trace (ST) 2 and gate pad 18, between the source trace (ST) 2 and gate pad (GP) 16, between the gate trace (GT) 6 and source pad (SP) 18, and between the gate trace (GT) 6 and gate pad (GP) 16, respectively, to allow the source trace (ST) 2, gate pad (GP) 16, gate trace (GT) 6, and source pad (SP) 18 to have a same potential; forming the source spray electrode (SE) 8; forming the gate spray electrode 10; and cutting the wire bonds 82, 80, 86, and 84 which are formed to provide the same potential.

Some steps of the method of fabricating the semiconductor device according to the first embodiment can damage the transistor 12 while being carried out. For example, at forming the insulating films and spray electrodes with the spray technique, high voltages not less than 20 V can be applied across the gate and source electrodes of the transistor 12 and across the gate and drain electrodes thereof. Such damage due to high voltages will reduce the manufacturing yield of the semiconductor device 20. In order to protect the semiconductor device 20 against the damage due to high voltages and increase the manufacturing yield, it is necessary to potentially ensure 0 V across the gate and drain terminals, across the gate and source terminals, and across the source and drain terminals in the transistor 12 at the manufacturing process. Accordingly, it is possible to electrically connect the terminals using the wire bonds 82, 80, 86, and 84 having small diameters, such as an about 30 μm gold wires, for example, as shown in FIG. 2 and perform the step of removing the wire bonds 82, 80, 86, and 84 after all the manufacturing steps are completed.

(Step of Forming Insulating Film)

Figure 3:
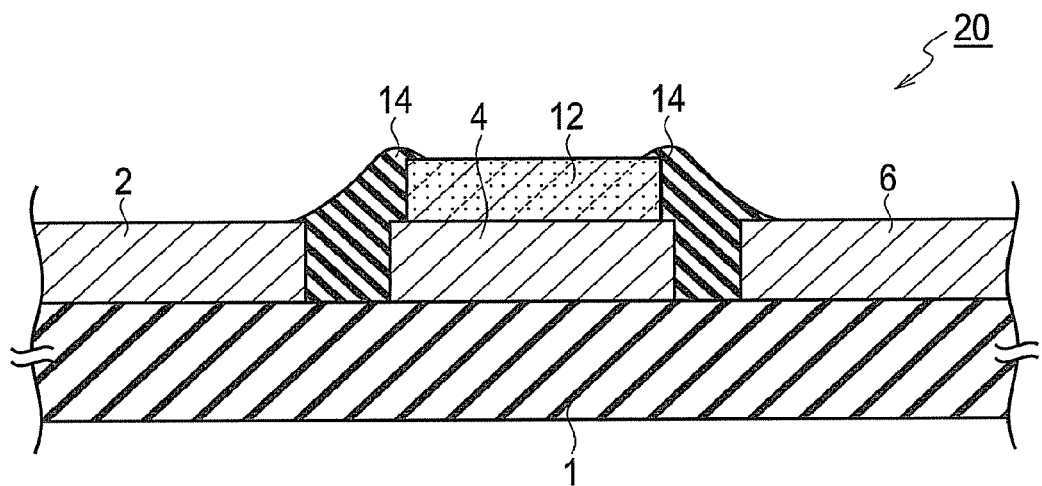
FIG. 3 is a schematic cross-sectional configuration diagram for explaining a step of the method of fabricating the semiconductor device according to the first embodiment of the present invention.

As shown in FIG. 3, the method of fabricating the semiconductor device according to the first embodiment further includes a step of forming the insulating films 14 covering the sidewall surfaces of the transistor 12 between the source trace 2 and drain trace 4, between the gate trace 6 and train trance electrode 4 on the substrate 1. Herein, the insulating films 14 are made of any one of silicone resin, polymer resin, polyimide resin, and epoxy resin, for example.

The step of forming the insulating films 14 is carried out by applying and thermosetting an electrically insulating material such as silicone resin, polymer resin, polyimide resin, epoxy resin, or potting materials.

In the case of the SiC MOSFET, this step is essential in order to prevent breakdown at the edge or corners of the SiC MOSFET due to discharge in air. The material including silicone resin, polymer resin, polyimide resin, or epoxy resin can be applied by a syringe.

(Step of Forming Protecting Film)

The step of forming the protecting films 17 on the insulting films 14 of the semiconductor device 20 is shown as illustrated in FIG. 4. Herein, the protecting films 17 may be made of any one of silicone resin, polymer resin, polyimide resin, and epoxy resin.

Figure 5B:
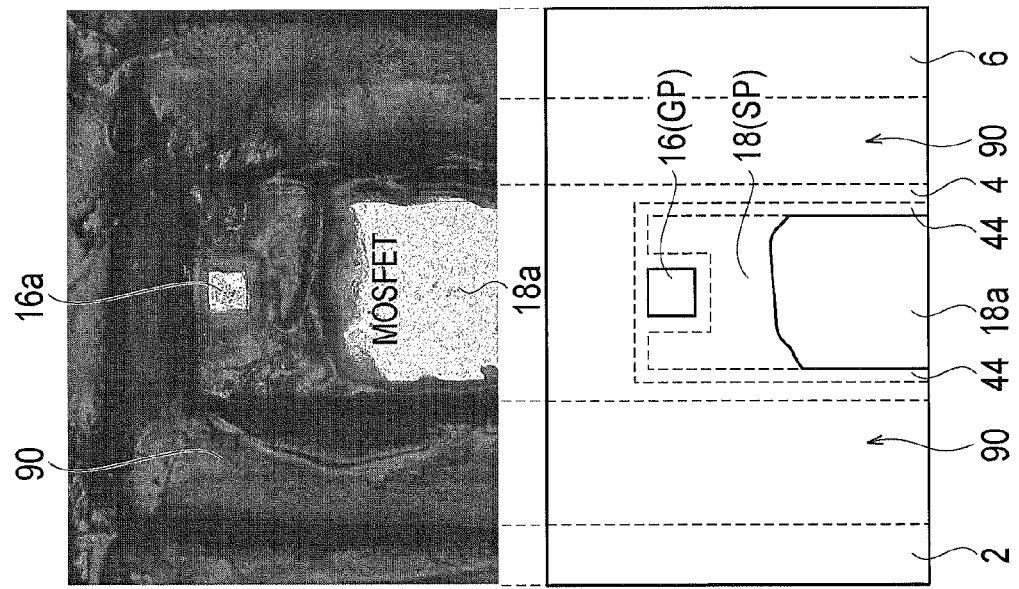
FIG. 5B is another plane pattern photograph example for explaining a step of the method of fabricating the semiconductor device according to the first embodiment of the present invention.
Figure 5A:
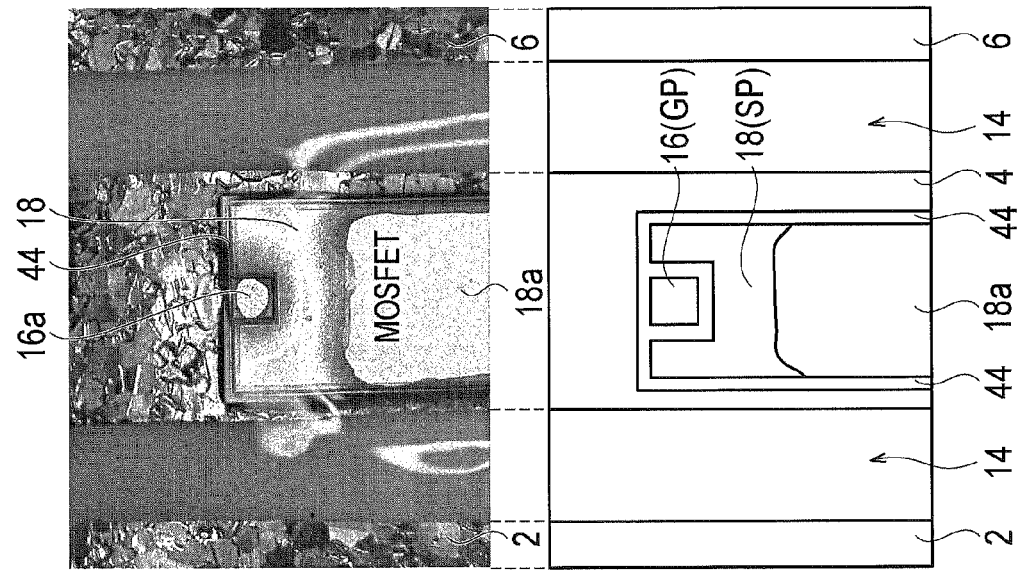
FIG. 5A is a plane pattern photograph example for explaining a step of the method of fabricating the semiconductor device according to the first embodiment of the present invention.

FIG. 5A shows an plane pattern photograph example for explaining a step of the method of fabricating the semiconductor device according to the first embodiment and an explanatory view of the same. FIG. 5A is a plane pattern photograph after the insulating films 14 are formed before the protecting films 17 are formed as shown in FIG. 3. In FIG. 5A, the insulating films 14 are formed between the source trace 2 and drain trace 4, between the gate trace 16 and drain trace 4, and on the guard ring 44 of the transistor 12. FIG. 5A, also shows the gate pad (GP) 16, source pad (SP) 18, a solder layer 16a on the gate pad (GP) 16, and a solder layer 18a on the source pad (SP) 18 after the insulating films 14 are formed. In the example of FIG. 5A, the insulating films 14 are made of transparent polyimide resin.

FIG. 5B shows an plane pattern photograph example for explaining a step of the method of fabricating the semiconductor device according to the first embodiment and an explanatory view of the same. FIG. 5B is a plane pattern photograph after the insulating films 14 are formed and the protecting films 17 are then formed as shown in FIG. 4. FIG. 5B shows the protecting films 17 formed on the entire plane pattern except the solder layer 16a on the gate pad (GP) 16 and the solder layer 18a on the source pad (SP) 18. In the example of FIG. 5B, the protecting films 17 are made of silicone resin.

In the method of fabricating the semiconductor device according to the first embodiment, the surface of the transistor 12 includes an important part which needs to be protected. For example, the guard ring 44 is formed within the transistor 12 in order to prevent breakdown voltage. If the structure of this guard ring 44 is exposed to the outside air in the surface of the transistor 12, the withstanding voltage will be reduced, and the current leakage will increase. This requires protection with an insulating film over the guard ring 44. Without such protection, electrical shorts can occur across the terminals of the transistor 12 in the step of forming the electrodes of the semiconductor device according to the first embodiment. Accordingly, in order to prevent current leakage between the applied source spray electrode (SE) 8 and guard ring 44 and between the gate spray electrode 10 and guard ring 44, it is desirable that the insulating films 14 and protecting films 17 have sufficient thickness and are formed along the gourd ring 44.

On the transistor 12, the gate pad (GP) 16 and source pad (SP) 12 are placed. On the gate pad (GP) 16, the solder layer 16a is placed, and on the source pad (SP) 18, the solder layer 18a is placed. The insulating films 14 or protecting films 17 are formed around the gate pad (GP) 16, the source pad (SP) 18, the solder layer 16a on the gate pad (GP) 16, and the solder layer 18a on the source pad (SP) 18.

Figure 6:
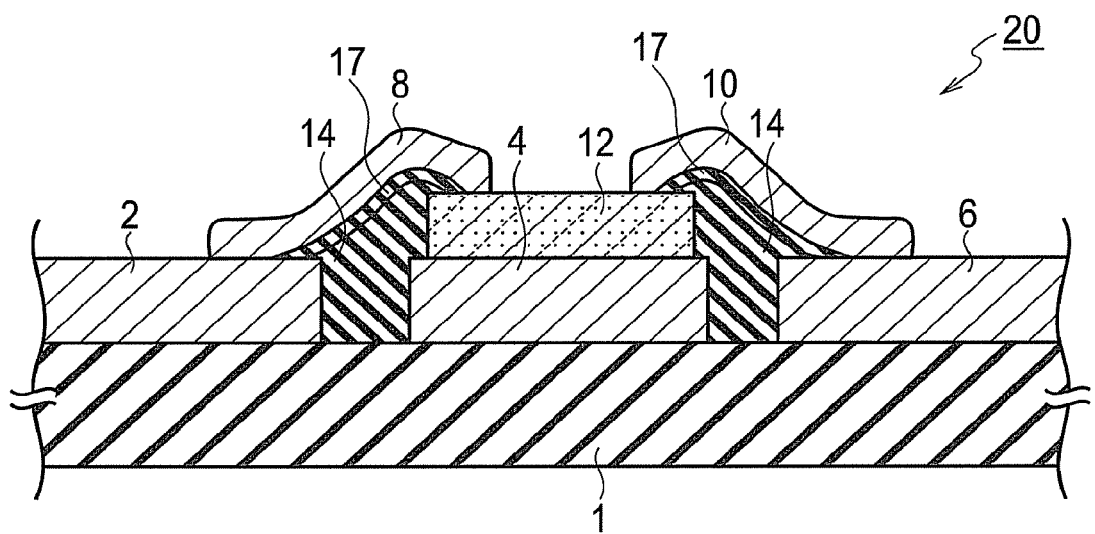
FIG. 6 is a schematic cross-sectional configuration diagram for explaining a step of the method of fabricating the semiconductor device according to the first embodiment of the present invention.

As shown in FIG. 6, the method of fabricating the semiconductor device according to the first embodiment includes: a step of forming the source spray electrode 8, which connects the source pad 18 of the transistor 12 and the source trace 2, on the insulating film 14 and protecting film 17 provided between the source trace 2 and drain trace 4; and a step of forming the gate spray electrode 10, which connects the gate pad 16 of the transistor 12 and the gate trace 6, on the insulating film 14 and protecting film 17 provided between the gate trace 6 and drain trace 4.

(Spray Technique)

Figure 7:
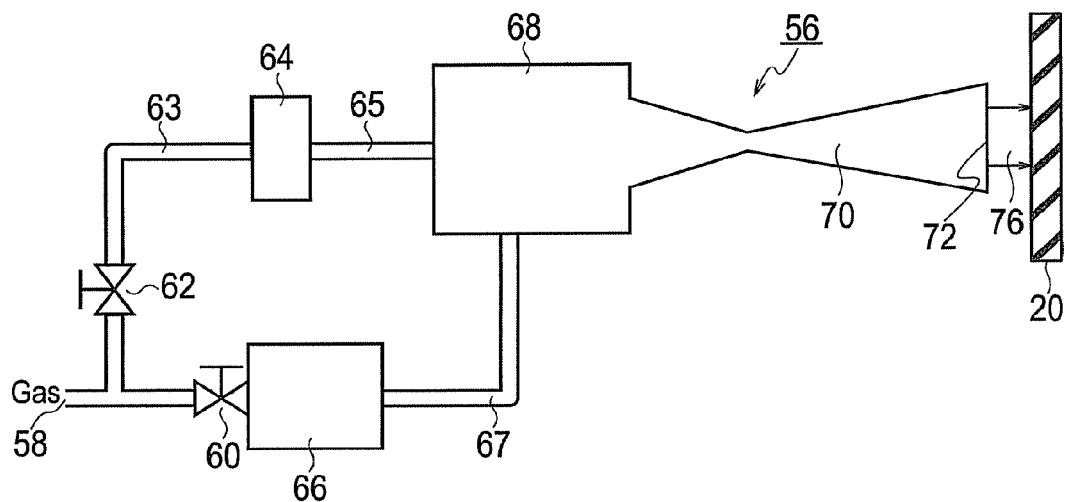
FIG. 7 is a schematic configuration diagram of a spray apparatus applied to the method of fabricating the semiconductor device according to the first embodiment of the present invention.

As shown in FIG. 7, the schematic configuration of a spray apparatus 56 applied to the method of fabricating the semiconductor device 20 according to the first embodiment includes: a gas inlet port 58; valves 60 and 62 switching gas supplied from the gas inlet port 58; a powder supply container into which the gas supplied through the valve 62 and a tube 63 is introduced; a heater 66 to which the gas supplied through the valve 60 is introduced; a spray gun 68 to which powder for deposition supplied from the powder supply container 64 through a tube 65 and the gas supplied from the heater 66 through a tube 67 are introduced; a nozzle 70 spraying the powder supplied from the spray gun 68; an aperture 72 placed at the outlet of the nozzle 70; and a sprayed powder 76 outputted through the aperture 72. Herein, the sprayed power 76 is deposited on the surface of the semiconductor device 20.

The type of the gas supplied from the gas inlet 58 is for example, helium, nitrogen, air, or the like.

Examples of the power supplied form the powder supply container 64 are metals, alloys, polymers, and mixtures thereof having a particle size of 1 to 50 μm.

The sprayed powder 76 is sprayed from the spray gun 68 through the nozzle 70 at a high particle speed of about 300 to 1200 m/s, for example, as a jet of gas and metals, alloys, polymers, or mixtures thereof having a particle size of 1 to 50 μm.

Using the spray apparatus 56 shown in FIG. 7, the spray electrodes can be formed on the semiconductor device 20 with, for example, copper, silver, aluminum, platinum, palladium, nickel-chrome alloy, nickel-aluminum alloy, nickel-chrome-silicon alloy, nickel-silicon alloy, copper-nickel alloy, or the like.

Figure 8:
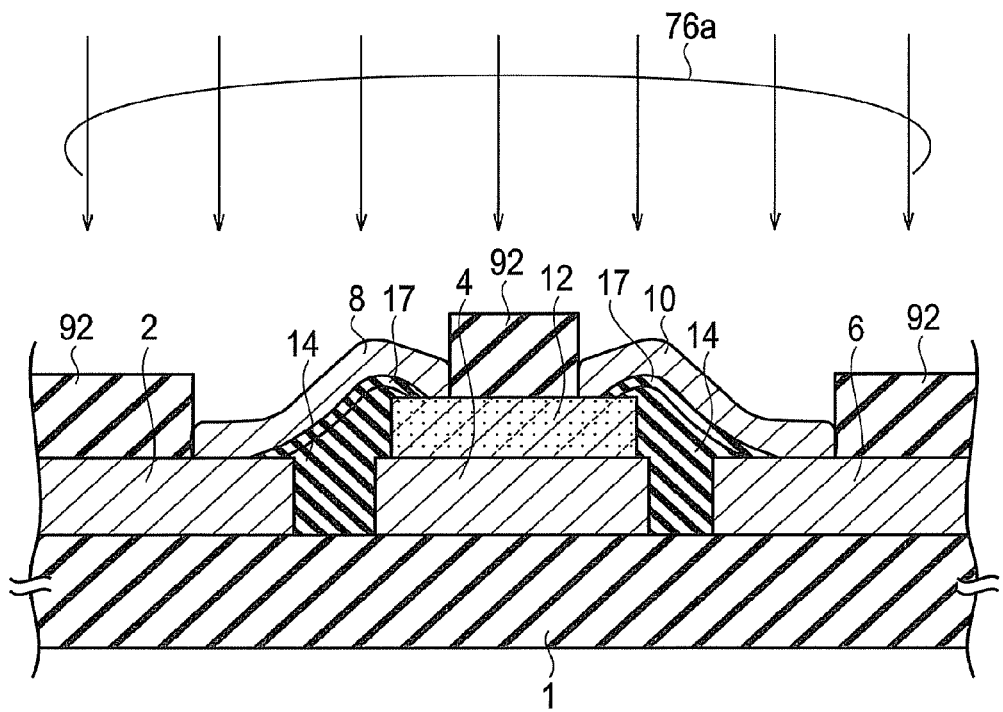
FIG. 8 is a schematic cross-sectional configuration diagram for explaining a step of the method of fabricating the semiconductor device according to the first embodiment of the present invention.

Herein, as shown in FIG. 8, the step of forming the source spray electrode 8 and the step of forming the gate spray electrode 10 may include: a step of applying masking tapes 92 on the source trace 2, gate trace 6, and transistor 12; a step of depositing the sprayed powder 76a by the spray technique to simultaneously form the source spray electrode 8 and gate spray electrode 10; and a step of removing the masking tapes 92.

The masking tapes 92 are placed on the surfaces of the transistor 12, source trace 2, and gate trace 6. The masking tapes 92 form a predetermined pattern for final electrical connection. The pattern of the masking tapes 92 is determined by the geometric shape and pattern and has a role of protecting against overspray which can occur at the step of forming the spray electrodes. The overspray can cause current leakage or an electrical short between the terminals of the transistor 12. It is therefore desirable that the source trace 2 and gate trace 6 are formed at predetermined positions using the masking tapes 92.

At the step of forming the spray electrodes, the metal is directly sprayed on the surface of the transistor 12, on the surfaces of the insulating films 14 or protecting films 17, and the surfaces of the source and gate traces 2 and 6. The sprayed metal can be a wide variety of materials, and examples thereof are copper, silver, nickel, aluminum, platinum, palladium, nickel-chrome (Ni—Cr) alloy, nickel-aluminum (Ni—Al) alloy, nickel-chrome-silicon (Ni—Cr—Si) alloy, nickel-silicon (Ni—Si) alloy, copper-nickel (Cu—Ni) alloy, and the like.

The metallic material is sprayed by depositing heated powder of an appropriate material through the spray gun 68. The aperture 72 may or may not be used. The opening shape of the aperture 72 is a rectangle with a size of about 2×2 mm, about 1×2 mm, or about 0.5×2 mm, for example.

The reason for narrowing the opening shape of the aperture 72 in such a manner is to minimize the thermal effect due to the spray electrodes deposited on the surface of the transistor 12 and the volume of deposited particles.

The thicknesses of the source and gate traces 2 and 6 formed by the aforementioned spray technique can be not more than 1 mil (25 μm) and up to 100 mil at the maximum (2500 μm). This spray technique allows interconnection through a plurality of metallic pads depending on the number of metallic pads on the transistor 12.

In order to minimize the temperature of the surface of the transistor 12, the spray gun 68 may be configured to move by a directed air jet over the surface of the semiconductor device 20 with a program forming random trajectories.

The masking tapes 92 are removed after the metal of the source and gate spray electrodes 8 and 10 is deposited.

Figure 9A:
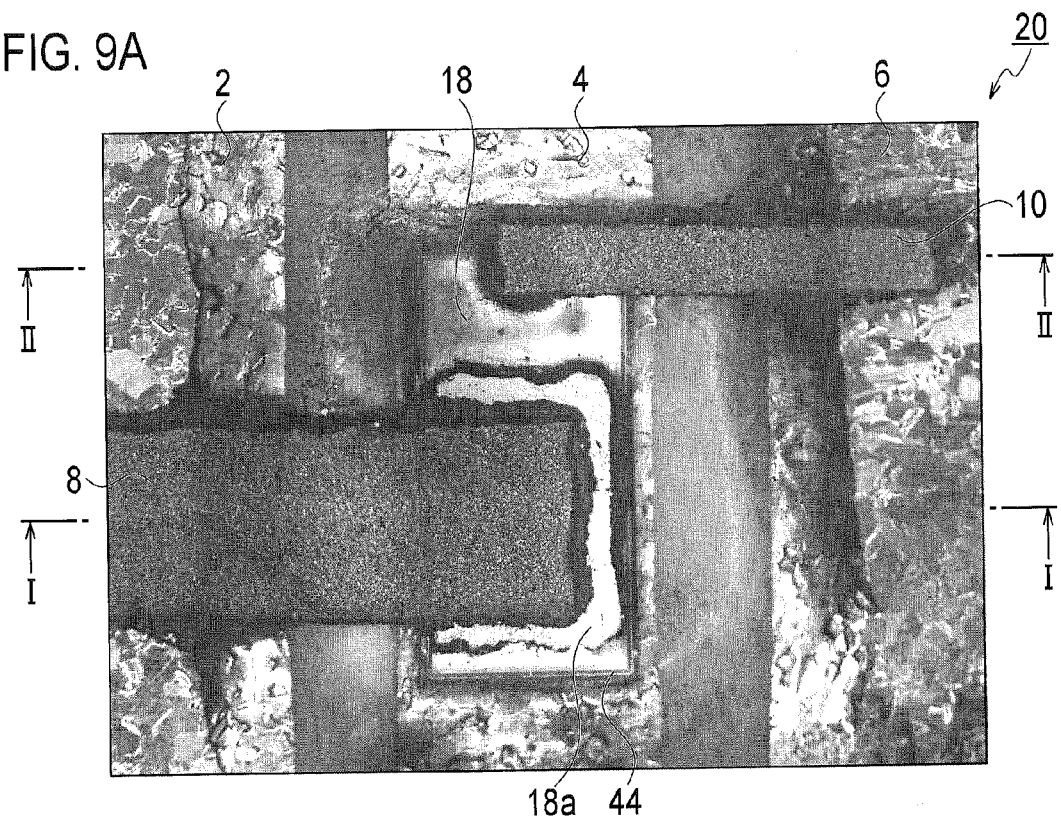
FIG. 9A is a plane pattern photogram example for explaining a step of the method of fabricating the semiconductor device according to the first embodiment of the present invention.

A plane pattern photograph example for explaining a step of the method of fabricating the semiconductor device according to the first embodiment is illustrated as shown in FIG. 9A, and the explanatory view of FIG. 9A is illustrated as shown in FIG. 9B.

As shown in FIGS. 9A and 9B, the source spray electrode (SE) 8 is connected to between the source trace (ST) 2 and the solder layer 18a formed on the source pad (SP) 18 of the transistor 12. In a similar manner, as shown in FIGS. 9A and 9B, the gate spray electrode (GE) 10 is connected to between the gate trace (GT) 6 and the solder layer 16a formed on the gate pad (GP) 16 of the transistor 12 (see FIG. 5).

The source spray electrode (SE) 8 has a width of about 200 to 300 μm and a thickness of about 0.2 mm, for example. The gate spray electrode (GE) 10 has a width of about 50 to 100 μm and a thickness of about 0.2 mm, for example.

Figure 10A:
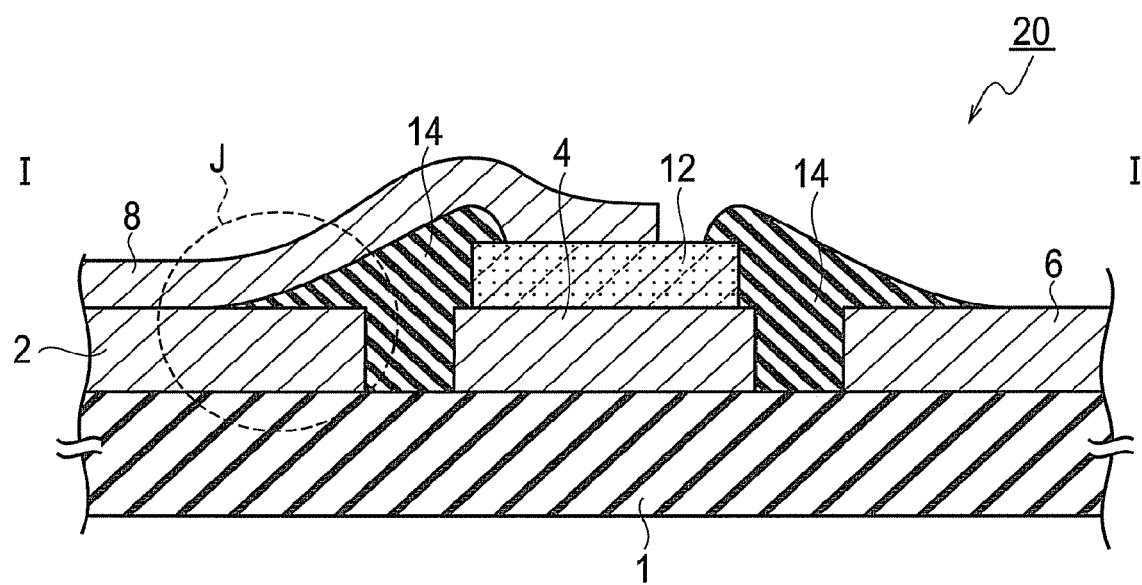
FIG. 10A is a schematic cross-sectional configuration diagram of FIG. 9A along a line I-I.
Figure 10B:
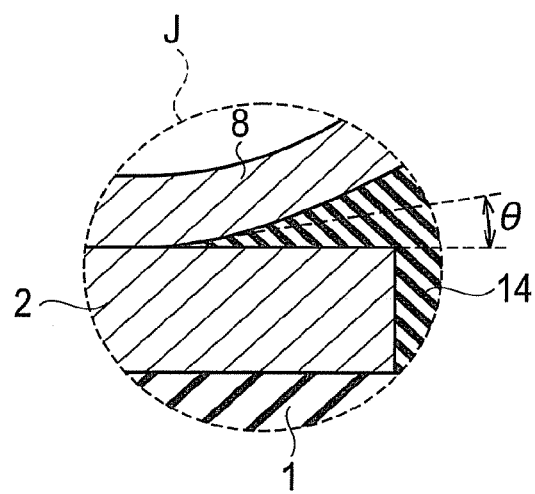
FIG. 10B is an enlarged view of a part J of FIG. 10A.
Figure 11:
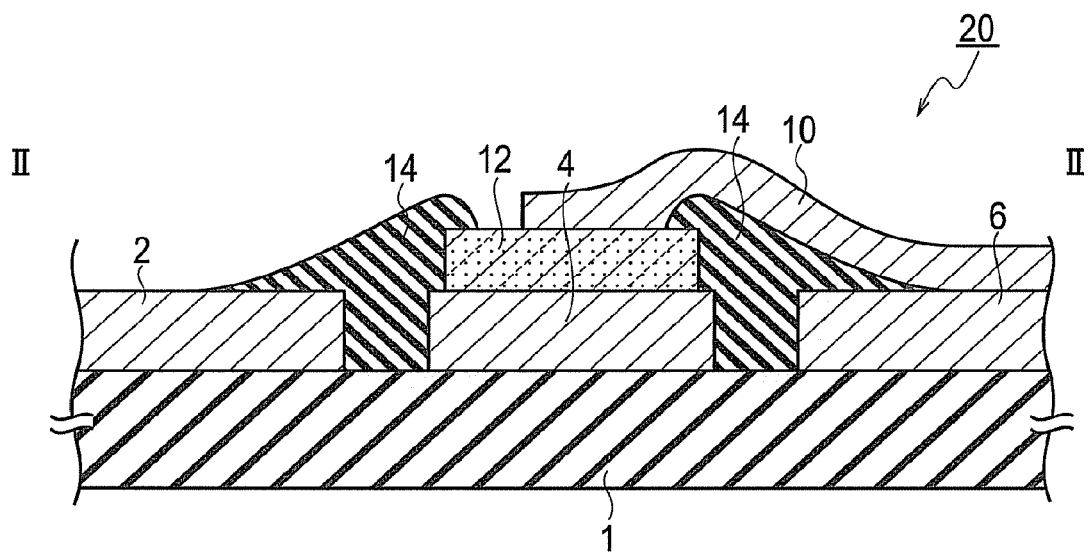
FIG. 11 is a schematic cross-sectional diagram of FIG. 9A along a line II-II.

The schematic cross-sectional structure along a line I-I of FIG. 9A is illustrated as shown in FIG. 10A, and an enlarged view of a part J of FIG. 10A is illustrated as shown in FIG. 10B. The schematic cross-sectional structure along a line II-II of FIG. 9A is illustrated as shown in FIG. 11. FIGS. 10 and 11 do not show the protecting films 17. In FIG. 10B, an angle θ of the tapered shape in the part J in which the source spray electrode (SE) 8 comes into a contact with the source trace 2 is desirably about 20 to 30 degrees. The contact area between the source spray electrode (SE) 8 and source trace 2 are therefore increased to reduce the contact resistance and prevent separation thereof. The angle of the tapered shape in the part where the gate spray electrode (GE) 10 comes into contact with the gate trace 6, which is not shown in the drawings, is also desirably about 20 to 30 degrees. The contact area between the gate spray electrode (GE) 10 and gate trace 6 are therefore increased to reduce the contact resistance and prevent separation thereof.

Figure 12A:
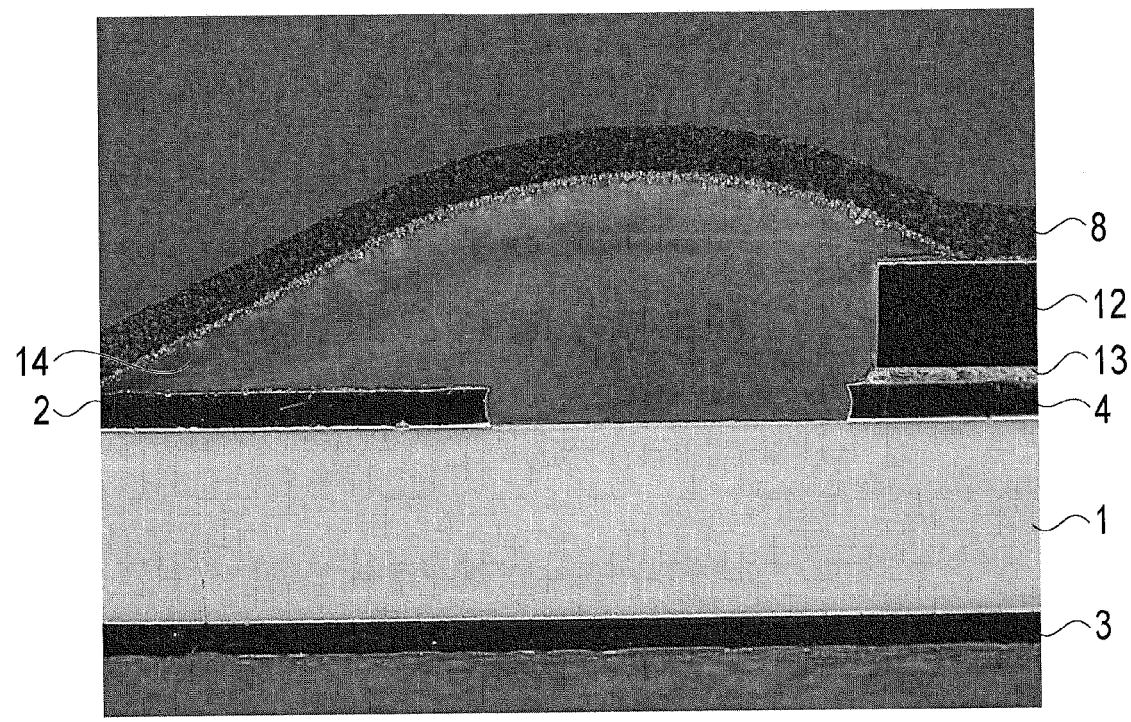
FIG. 12A is an example of a cross-sectional photograph for explaining a step of the method of fabricating the semiconductor device according to the first embodiment of the present invention.
Figure 12B:
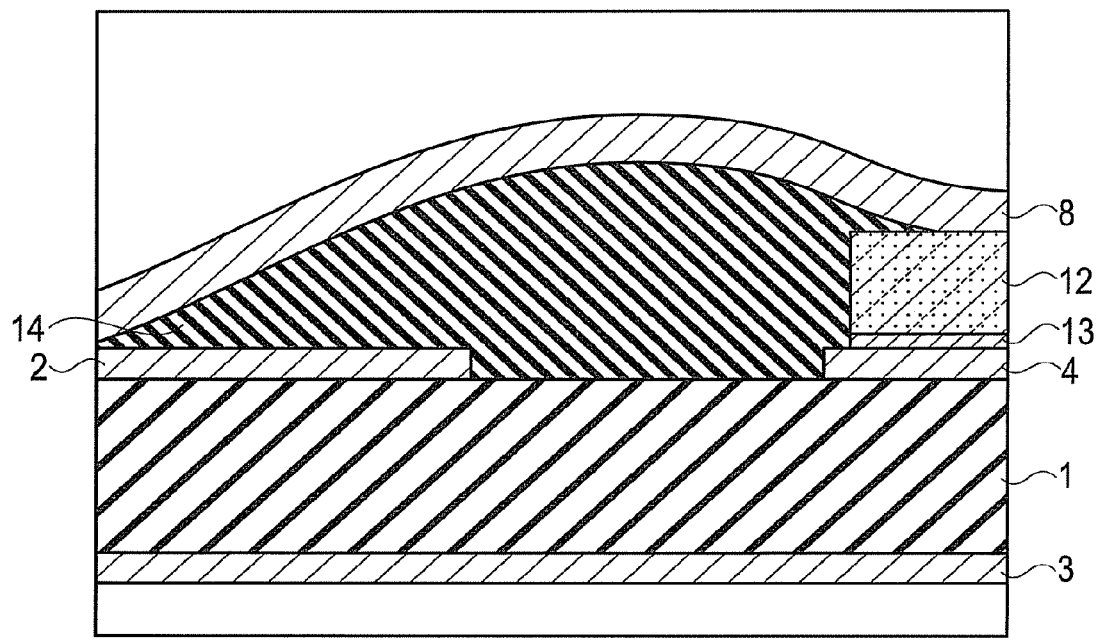
FIG. 12B is a schematic cross-sectional configuration diagram for explaining FIG. 12A.

As a cross-sectional photograph example for explaining a step of the method of fabricating the semiconductor device according to the first embodiment, an enlarged photograph around the source spray electrode (SE) 8 and source trace (ST) is illustrated as shown in FIG. 12A. The schematic cross-sectional structure explaining FIG. 12A is illustrated as shown in FIG. 12B. The transistor 12 is connected to the top of the drain trace 4 through the solder layer 13, and a rear electrode 3 is placed on the rear surface of the substrate 1.

In the example of FIG. 12, the substrate 1 is made of ceramic composed of alumina ($Al_2O_3$) and has a thickness of about 0.65 mm. Each of the rear electrode 3, source spray electrode (SE) 8, source trace (ST) 2, and drain trace 4 is made of copper (Cu) and has a thickness of about 0.2 mm. The insulating films 14 are made of polyimide resin and have a maximum thickness of about 2 mm.

In the example of FIG. 12, formation of the protecting films 17 is omitted. The protecting films 17 are not always necessary and may be formed as a layer of each insulating film 14. Alternatively, the protecting films 17 and insulating films 14 may be made of a same material to be formed as a substantially single layer.

MODIFIED EXAMPLE OF THE FIRST EMBODIMENT

The step of forming the insulating films 14 may be replaced with a step of forming a plurality of ceramic layers with a spray technique.

Figure 13:
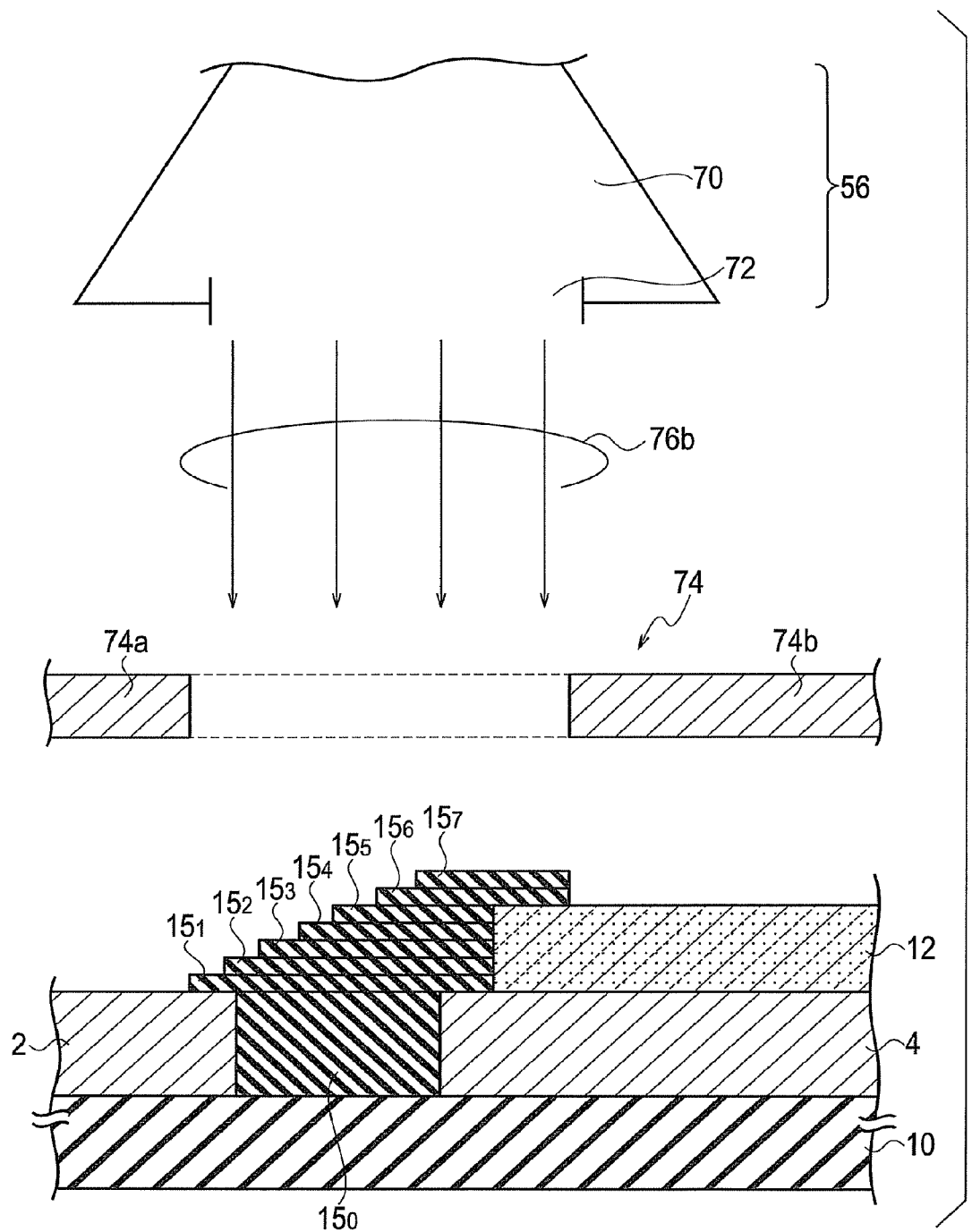
FIG. 13 is a schematic configuration diagram for explaining a ceramic deposition step using the spray apparatus in a method of fabricating the semiconductor device according to a modified example of the first embodiment of the present invention.

In the method of fabricating the semiconductor device according to a modified example of the first embodiment, the schematic configuration for explaining the ceramic deposition step using the spray apparatus 56 is illustrated as shown in FIG. 13.

Instead of the insulating films 14, as shown in FIG. 13, a laminated film including ceramic layers $15_0$, $15_1$ ..., and $15_7$ formed with the spray technique. The ceramic layers $15_0$, $15_1$ ..., and $15_7$ may be made of alumina.

In the method of fabricating the semiconductor device according to the modified example of the first embodiment, as shown in FIG. 13, the sprayed powder 76b sprayed out from the nozzle 70 of the spray apparatus 56 through the aperture 72 is deposited on the semiconductor device 20 through masks 74 (74a, 74b). The width between the masks 74a ad 74b is changed according to the geometrical pattern of the deposited ceramic layers $15_0$, $15_1$ ..., and $15_7$.

In the step of depositing the ceramic layers $15_0$, $15_1$ ..., and $15_7$ directly on the semiconductor device 20 using the spray technique, when being sprayed onto the surface of the semiconductor device 20, the material of the ceramic layers $15_0$, $15_1$ ..., and $15_7$ cannot be sprayed on the side surface of the transistor 12. In this case, the transistor 12 will break down with high voltage due to discharge in air at the edges. The means for solving this problem is spraying the ceramic layers $15_0$, $15_1$ ..., and $15_7$ in the form of layers as shown in FIG. 13 and stack the same in the vertical direction of the transistor 12 until the ceramic layers $15_0$, $15_1$ ..., and $15_7$ finally cover a part of the top surface of the transistor 12. The number of the ceramic layers is not limited to eight in the above example.

The material of the ceramic layers can be, for example, alumina ($Al_2O_3$), aluminum nitride (AlN), silicon nitride (SiN), or the like.

(Three-Phase Inverter)

Figure 14:
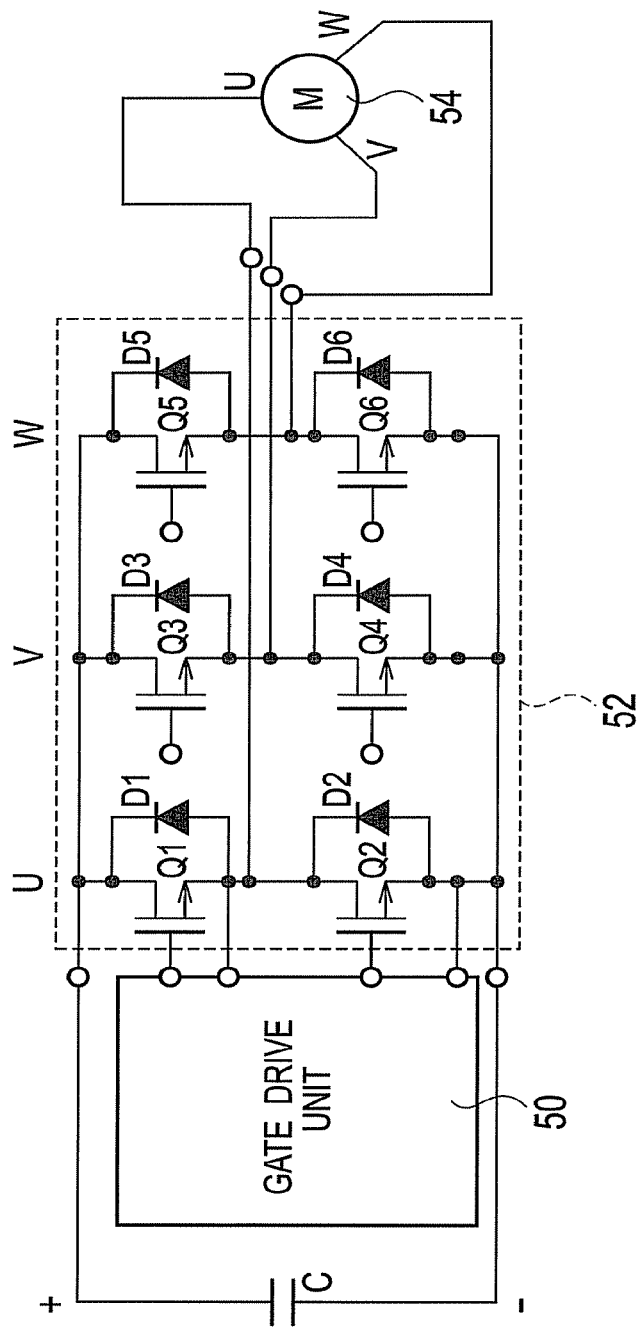
FIG. 14 is a schematic circuit diagram of a three-phase inverter including the semiconductor device according to the first embodiment of the present invention or a modified example thereof.

As shown in FIG. 14, the schematic circuit configuration of a three-phase inverter including the semiconductor device 20 according to the present invention includes: a gate drive unit 50; a power module unit 52 connected to the gate drive unit 50; and a three-phase motor unit 54. The power module unit 52 includes U, V, and W-phase inverters connected corresponding to the U, V, and W phases of the three-phase motor unit 54, respectively.

In the power module unit 52, each pair of SiC MOSFETs Q1 and Q2, Q3 and Q4, and Q5 and Q6, constituting each inverter, are connected to between plus (+) and minus (−) terminals, which are connected to a capacitor C. Diodes D1 to D6 are connected between the sources and drains of the SiC MOSFETs Q1 to Q6 in anti-parallel, respectively.

The semiconductor device 20 according to the first embodiment is applied to each of the SiC MOSFETS Q1 to Q6.

(SiC MOSFET)

Figure 15:
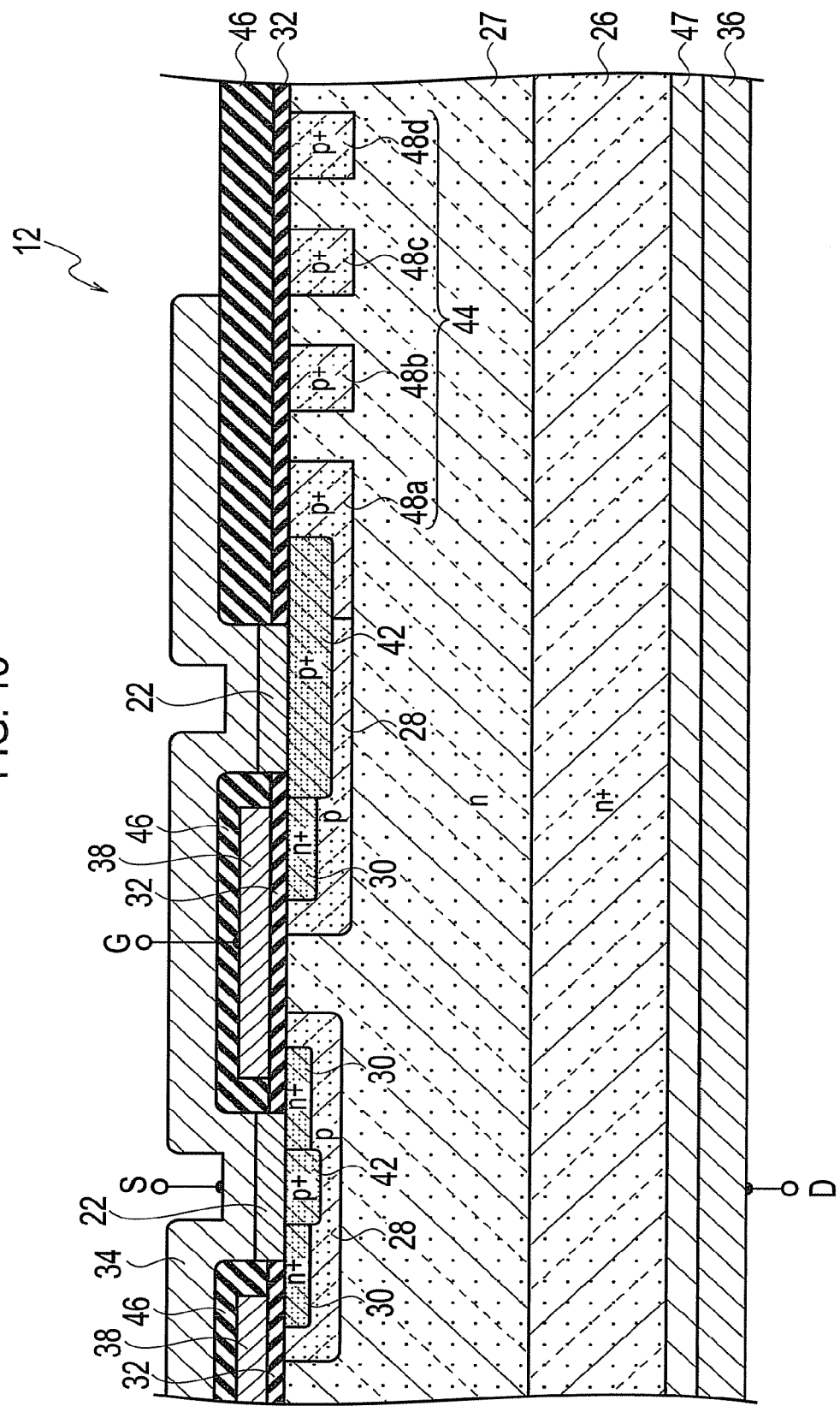
FIG. 15 is a schematic cross-sectional configuration diagram of an SiC MOSFET as a semiconductor device example applied to the semiconductor device according to the first embodiment of the present invention or a modified example thereof.

As shown in FIG. 15, the schematic cross-sectional structure of the SiC MOSFET as an example of the semiconductor device 20 according to the first embodiment includes: an $n^+$-type semiconductor substrate 26; an n-type semiconductor layer 27 formed on the $n^+$-type semiconductor substrate 26; p base regions 28 formed in a surface side of the n-type semiconductor layer 27; $p^+$ guard ring diffusion layers 48a to 48d formed in a surface side of the n-type semiconductor layer 27; $n^+$ source regions 30 formed on surfaces of the p base regions 28; p base contact regions 42 formed on surfaces of the p base regions 28; gate insulating films 32 each placed between adjacent p base regions 28 on the surface of the n-type semiconductor layer 27; gate electrodes 38 placed on the gate insulating films 32; a source electrode 34 connected to the $n^+$ source regions 30 and p base contact regions 42; and a drain electrode 36 placed on the rear surface of the $n^+$-type semiconductor substrate 26 on the opposite side to the surface thereof.

A barrier metal layer 47 is placed between the semiconductor substrate 26 and drain electrode 36. Barrier metal layers 22 are placed between the source electrode 34 and each n+ source region 30 and between the source electrode 34 and each p base contact region 42.

Herein, the source electrode 34 is connected to the source pad (SP) 18, and the gate electrode 38 is connected to the gate pad (GP) 16.

The transistor mounted on the semiconductor device according to the first embodiment may be a GaNFET instead of the SiC MOSFET.

In the transistor mounted on the semiconductor device according to the first embodiment, the source and drain regions may be replaced with each other. In such a case, the source pad (SP) of the transistor is formed as the drain pad (DP), and the rear electrode is formed as the source electrode. The source trace (ST) is formed as the drain trace (DT), and the drain trace (ST) is formed as the source trace (ST).

According to the present invention, it is possible to provide a semiconductor device with considerably reduced parasitic inductance or resistance and improved high frequency switching performance.

Other Embodiments

As described above, the present invention is described using the first embodiment and modified example, but the description and drawings constituting a part of the disclosure are just illustrative and should not be considered to limit the present invention. From this disclosure, various substitutions, examples, and operational techniques of the invention will be apparent to those skilled in the art.

The present invention includes various embodiments not described in this disclosure as described above.

INDUSTRIAL APPLICABILITY

The semiconductor device of the present invention is applicable to all power devices including power semiconductor modules and intelligent power modules.

REFERENCE SIGNS LIST

1: SUBSTRATE;
2: SOURCE TRACE (ST);
3: REAR ELECTRODE;
4: DRAIN TRACE (DT);
6: GATE TRACE (GT);

8: SOURCE SPRAY ELECTRODE (SE);
10: GATE SPRAY ELECTRODE (GE);
12: TRANSISTOR;
13, 16A, 18A: SOLDER LAYER;
14: INSULATING FILM;
15, $15_0$, $15_1$ ..., $15_7$: CERAMIC LAYER;
16: GATE PAD (SP);
17: PROTECTING FILM;
18: SOURCE PAD (SP);
20: SEMICONDUCTOR DEVICE;
22, 47: BARRIER METAL LAYER;
24: DRAIN REGION:
26: SEMICONDUCTOR SUBSTRATE
27: EPITAXIAL LAYER;
28: BASE REGION;
30: SOURCE REGION;
32: GATE INSULATING FILM;
34: SOURCE ELECTRODE;
36: SOURCE ELECTRODE;
38: GATE ELECTRODE;
40: CONTACT LAYER;
42: BASE CONTACT REGION;
44: GUARD RING;
46: INTERLAYER DIELECTRIC FILM;
48A TO 48D: GUARD RING DIFFUSION LAYER;
50: GATE DRIVE UNIT;
52: POWER MODULE UNIT;
54: THREE-PHASE MOTOR UNIT;
56: SPRAY APPARATUS;
58: GAS INLET;
60, 62: VALVE;
64: POWDER SUPPLY CONTAINER;
63, 65, 67: TUBE;
66: HEATER;
68: SPRAY GUN;
70: NOZZLE;
72: APERTURE;
74, 74A, 74B: MASK;
76, 76A, 76B: SPRAYED POWDER;
80, 82, 84, 86: WIDE BOND;
88: SEALING LAYER; AND
92: MASKING TAPE.

The invention claimed is:
1. A semiconductor device comprising:
a substrate;
a source trace, a drain trace, and a gate trace placed on the substrate;
a transistor which is placed on the drain trace and includes a source pad and a gate pad;
insulating films placed between the drain and source traces and between the drain and gate traces on the substrate to cover sidewall surfaces of the transistor;
a source spray electrode which is placed on the insulating film between the source and drain traces and connects the source pad of the transistor and the source trace;
a gate spray electrode which is placed on the insulating film between the gate and drain traces and connects the gate pad of the transistor and the gate trace; and
a protecting film placed on a surface of each insulating film, the protecting film being located any one of between the insulating film and the source spray electrode, and between the insulating film and the gate spray electrode.
2. The semiconductor device according to claim 1, wherein the insulating films are made of any one of silicone resin, polymer resin, polyimide resin, and epoxy resin.
3. The semiconductor device according to claim 1, wherein each of the insulating films is formed of a laminate film composed of ceramic layers formed by a spray technique.
4. The semiconductor device according to claim 3, wherein each of the ceramic layers is made of any one of alumina, aluminum nitride, and silicon nitride.
5. The semiconductor device according to claim 1, wherein each of the source and gate spray electrodes is made of any one of copper, silver, nickel, aluminum, platinum, palladium, nickel-chrome alloy, nickel aluminum alloy, nickel-chrome-silicon alloy, nickel-silicon alloy, and copper-nickel alloy.
6. The semiconductor device according to claim 1, wherein the protecting film is made of any one of silicone resin, polymer resin, polyimide resin, and epoxy resin.
7. The semiconductor device according to claim 1, wherein the transistor is composed of an SiC or GaN semiconductor.
8. A method of fabricating a semiconductor device comprising:
forming a substrate;
forming a source trace, a drain trace, and a gate trace on the substrate;
forming a transistor on the drain trace, the transistor including a source pad and a gate pad;
forming insulating films between the source and drain traces and between the gate and drain traces on the substrate, the insulating films covering sidewall surfaces of the transistor;
forming a source spray electrode on the insulating film between the source and drain traces, the source spray electrode connecting the source pad of the transistor and the source trace;
forming a gate spray electrode on the insulating film between the gate and drain traces, the gate spray electrode connecting the gate pad of the transistor and the gate trace, wherein
the forming the source spray electrode and the forming the gate spray electrode include:
attaching masking tapes to the source trace, the gate trace, and the transistor;
forming the source and gate spray electrodes simultaneously with a spray technique; and
removing the masking tapes.
9. The method of claim 8, wherein
forming the insulating films includes forming a plurality of ceramic layers with a spray technique.
10. The method of claim 8, further comprising:
after forming the transistor on the drain trace, individually forming wire bonds between the source trace and source pad, between the source trace and gate pad, between the gate trace and the source pad, and between the gate trace and the gate pad; and
cutting the wire bonds after the forming the source spray electrode and the forming the gate spray electrode.
11. The method of claim 8 further comprising:
forming a protecting film on a surface of each insulating film.
12. The method of claim 8, wherein
the insulating films are made of any one of silicone resin, polymer resin, polyimide resin, and epoxy resin.
13. The method of claim 8, wherein
the insulating film is made of a laminate film including ceramic layers formed with a spray technique.

14. The method of claim 13, wherein
the ceramic layers are made of any one of alumina, aluminum nitride, and silicon nitride.

15. The method of claim 8, wherein
each of the source and gate spray electrodes is made of any one of copper, silver, nickel, aluminum, platinum, palladium, nickel-chrome alloy, nickel-aluminum alloy, nickel-chrome-silicon alloy, nickel-silicon alloy, and copper-nickel alloy.

16. The method of claim 11, wherein
the protecting film is made of any one of silicone resin, polymer resin, polyimide resin, and epoxy resin.

\* \* \* \* \*